United States Patent
Zhang et al.

(10) Patent No.: US 7,460,047 B2
(45) Date of Patent: Dec. 2, 2008

(54) METHOD FOR VCOM LEVEL ADJUSTMENT WITH INTEGRATED PROGRAMMABLE RESISTIVE ARRAYS

(75) Inventors: Yuxing Zhang, Shanghai (CN); Xiaoru Gao, Shanghai (CN)

(73) Assignee: STMicroelectronics R&D (Shanghai) Co. Ltd. (CN)

( * ) Notice: Subject to any disclaimer, the term of this patent is extended or adjusted under 35 U.S.C. 154(b) by 0 days.

(21) Appl. No.: 11/832,144

(22) Filed: Aug. 1, 2007

(65) Prior Publication Data
US 2008/0055138 A1 Mar. 6, 2008

(30) Foreign Application Priority Data
Sep. 4, 2006 (CN) ......................... 2006 1 0126289

(51) Int. Cl.
*H03M 1/66* (2006.01)
(52) U.S. Cl. .................. 341/144; 341/118; 341/120; 341/121
(58) Field of Classification Search ................ 341/118, 341/120, 121, 143, 144
See application file for complete search history.

(56) References Cited

U.S. PATENT DOCUMENTS

| | | | | |
|---|---|---|---|---|
| 5,264,703 A * | 11/1993 | Shibano et al. | ......... | 250/396 R |
| 5,534,889 A * | 7/1996 | Reents et al. | ................. | 345/89 |
| 6,204,785 B1 * | 3/2001 | Fattaruso et al. | ............ | 341/120 |
| 6,236,384 B1 * | 5/2001 | Didier et al. | .................. | 345/87 |
| 6,346,903 B1 * | 2/2002 | Messager | .................... | 341/154 |
| 6,452,526 B2 * | 9/2002 | Sagawa et al. | .............. | 341/144 |
| 6,680,733 B2 * | 1/2004 | Woo et al. | .................... | 345/212 |
| 7,138,996 B2 * | 11/2006 | Lee et al. | ..................... | 345/214 |
| 7,148,827 B2 * | 12/2006 | Lee | .............. | 341/118 |
| 7,400,312 B2 * | 7/2008 | Hung et al. | ................. | 345/100 |
| 2004/0085371 A1 * | 5/2004 | Lee et al. | ...................... | 346/45 |
| 2006/0023001 A1 * | 2/2006 | Sung et al. | .................. | 345/690 |
| 2006/0238473 A1 * | 10/2006 | Hashimoto | ................... | 345/89 |

\* cited by examiner

*Primary Examiner*—Linh V Nguyen
(74) *Attorney, Agent, or Firm*—Lisa K. Jorgenson; William J. Kubida

(57) ABSTRACT

A calibrator circuit and method for VCOM voltage adjustment for an LCD includes using integrated programmable resistive arrays. The method uses two DACs and three integrated circuit arrays to provide all of the advantages of VCOM calibrator circuits using external resistive voltage-dividers. The integrated circuit resistor arrays reduce the number of external components and PCB space. The method used is suitable for higher resolution adjustment of the VCOM voltage and no calculation is required in the whole adjustment procedure, which saves labor cost, time and enables automation of the calibrator fabrication.

20 Claims, 7 Drawing Sheets

METHOD FOR VCOM LEVEL ADJUSTMENT WITH INTEGRATED PROGRAMMABLE RESISTIVE ARRAYS

RELATED APPLICATION

The present application claims priority of Chinese Application No. 200610126289.7 filed Sep. 4, 2006, which is incorporated herein in its entirety by this reference.

BACKGROUND OF THE INVENTION

The present invention is related LCD panels and displays, and, more particularly, to a circuit and method for adjusting the "VCOM" level associated with the LCD panel.

As is well known in the art, the VCOM or common voltage of an LCD panel needs to be adjusted to remove undesirable flicker from the display. Various solutions to adjusting the VCOM voltage have been proposed in the prior art.

Ideally, the VCOM output should be adjusted as a certain value in the range from $(\frac{1}{3})*AVDD$ to $(\frac{2}{3})*AVDD$ (wherein AVDD is the main analog voltage supply for the LCD). The exact value necessary to remove flicker from the LCD display panels will vary according to different LCD manufacturers. If the actual VCOM output value deviates from the desired VCOM value, the LCD will flicker. The intensity of the flicker will increase the more the VCOM value deviates from the optimum desired value. The relationship between VCOM level distribution and LCD flicker intensity is shown in FIG. 1. Consequently, a user can readily determine the optimum VCOM level according to the flicker intensity of the LCD display.

FIG. 2 shows two types of VCOM calibrators 200 and 202, each using mechanical potentiometers. The circuit includes external resistor Rd and Rf as well as mechanical potentiometer that includes adjustable resistor Re. Resistors Rd, Re, and Rf are coupled between AVDD and ground, and a buffer coupled to the output of the potentiometer resistor Re. The output of the buffer provides the VCOM output signal for the LCD display. In circuit 200, the output of the potentiometer is fed directly into the positive input of the buffer. In circuit 202, the output of the potentiometer is coupled to the junction of resistors Re and Rf, and then fed into the positive input of the buffer. In circuit 200, the VCOM level output is given by:

$$VCOM = \frac{AVDD*(Rf + x*Re)}{Rd + Re + Rf} \quad x \in [0,1] \quad (1)$$

In circuit 202, the VCOM level output is:

$$VCOM = \frac{AVDD*Rf}{Rd + (1-x)*Re + Rf} \quad x \in [0,1] \quad (2)$$

As we can be seen from a review of equations (1) and (2), the VCOM level output can be changed by adjusting the resistive value of Re accordingly.

There are several drawbacks of using mechanical potentiometers to set the VCOM voltage. The resolution and reliability are relatively poor for a mechanical potentiometer. It is time consuming and labor intensive to mass produce LCD panels using mechanical potentiometers. Further, it is difficult to realize factory automation using mechanical potentiometers. To address these problems, panel manufacturers have started to use digital VCOM calibrators, which greatly simplifies the adjustment process and increases reliability.

FIG. 3 shows the implementation of a VCOM calibrator 300 with an external resistive voltage-divider. Calibrator 300 includes an interface and control block 302, a bus 304 for communicating with a single DAC ("Digital to Analog Converter") 308, and a bus 306 for communicating with non-volatile memory block 310. The output of DAC 308 is coupled to the positive input of buffer 312, which drives the gate of transistor M1. The source of transistor M1 is coupled to the $R_{SET}$ resistor at the SET node. The drain of transistor M1 is coupled to the output of an external resistor divider at the OUT node. The external resistor divider includes resistors R1 and R2, which is coupled between the AVDD power supply and ground. The OUT node is buffered through buffer 314 to provide the VCOM voltage.

In FIG. 3, the interface and control logic block 302 are used to manage digital signals such as clock, data in, data out, address and control signals. Non-volatile memories (NVMEM) 310 are used to store values of the desired VCOM level. The single DAC 308 is used to adjust the VCOM level. R1, R2 and $R_{SET}$ are external resistors that determine the adjustment range for the VCOM output.

The basic principle for the VCOM calibrator 300 with an external voltage-divider is as follows. The external resistive voltage-divider comprising R1 and R2 sets the maximum value of the VCOM adjustment range. Resistor $R_{SET}$ sets the full-scale sink current, $I_{OUT}$, which determines the minimum value of the VCOM adjustment range. A larger $R_{SET}$ value increases the resolution but decreases the VCOM adjustment range. The value of resistors R1, R2 and $R_{SET}$ can be calculated by using the following procedure.

1) Set an approximate adjustment range that contains the desired VCOM level. Set the maximum VCOM level as $V_{MAX}$ and the minimum VCOM level as $V_{MIN}$.
2) Calculate R1/R2 ratio as:

$$\frac{R1}{R2} \approx \frac{AVDD}{V_{MAX}} - 1 \quad (3)$$

3) Calculate $R1/R_{SET}$ ratio as:

$$\frac{R1}{R_{SET}} \approx \left(\frac{V_{MAX}}{V_{MIN}} - 1\right)*Y \quad (4)$$

where Y=the number of resistors R in DAC.
4) Choose $R_{SET}$ according to the electrical limitations.
5) Calculate R1 and R2.
6) Change the DAC value from 0 to $2^n-1$ (n is the bit number of DAC) to adjust the VCOM level between $V_{MIN}$ and $V_{MAX}$ until the optimum level is reached.

The range for the adjustment is given by:

$$\text{Range} = V_{MAX} - V_{MIN} \quad (5)$$

and the resolution is given by:

$$\text{Resolution} = \frac{V_{MAX} - V_{MIN}}{2^n - 1} \quad (6)$$

Where n is the resolution of DAC.

From the description above, there are some drawbacks to this method.
1) Since there is a tradeoff between the adjustment range and the resolution, the adjustment range is generally a small part of the overall possible range of VCOM distribution (generally from ⅓*AVDD to ⅔*AVDD, where AVDD is the analog voltage supply). Thus, it is firstly necessary to test and gain an approximate range that contains the desired VCOM level.
2) After the approximate range is found, it is also necessary to calculate the external resistors R1, R2 and $R_{SET}$ that determine the range.
3) The external resistors are, in general, less reliable and occupy PCB ("printed circuit board") area compared with integrated resistors.

What is desired, therefore, is a VCOM calibrator circuit for an LCD that can provide an optimum VCOM adjustment voltage, but does not use external resistors or potentiometers.

SUMMARY OF THE INVENTION

According to the present invention, a calibrator for providing an adjustable VCOM voltage includes a first DAC, a second DAC, a first resistor coupled between a power supply voltage and a calibrator output having an adjustable value controlled by the first DAC, a second resistor coupled between the calibrator output and ground having an adjustable value controlled by the first DAC, and a set resistor coupled between an output of the second DAC and ground, wherein the current flowing through the set resistor is sourced from the calibrator output. All three of the resistors are integrated circuit resistor arrays that are integrated into the same chip with the additional calibrator circuitry. The calibrator includes an interface and control logic block for receiving a clock signal and a data input signal, for providing a first digital input signal for the first DAC, and for providing a second digital input signal for the second DAC. The calibrator includes a non-volatile memory coupled to the interface and control logic block. The calibrator includes a buffer having a first input coupled to the second DAC, a second input coupled to the set resistor, and a current output coupled to the calibrator output. The calibrator also includes a buffer coupled to the calibrator output for providing a buffered VCOM voltage.

In operation, the output value of the first DAC is changed to select a sub-range that contains a desired calibrator output value, which is generally between one-third and two-thirds of the power supply voltage. The output value of the second DAC is then changed to achieve the desired calibrator output value.

BRIEF DESCRIPTION OF THE DRAWINGS

The above and other features and advantages of the invention will be more readily understood from the following detailed description of the invention which is provided in connection with the accompanying drawings, in which.

DESCRIPTION OF THE INVENTION

Figure 4:
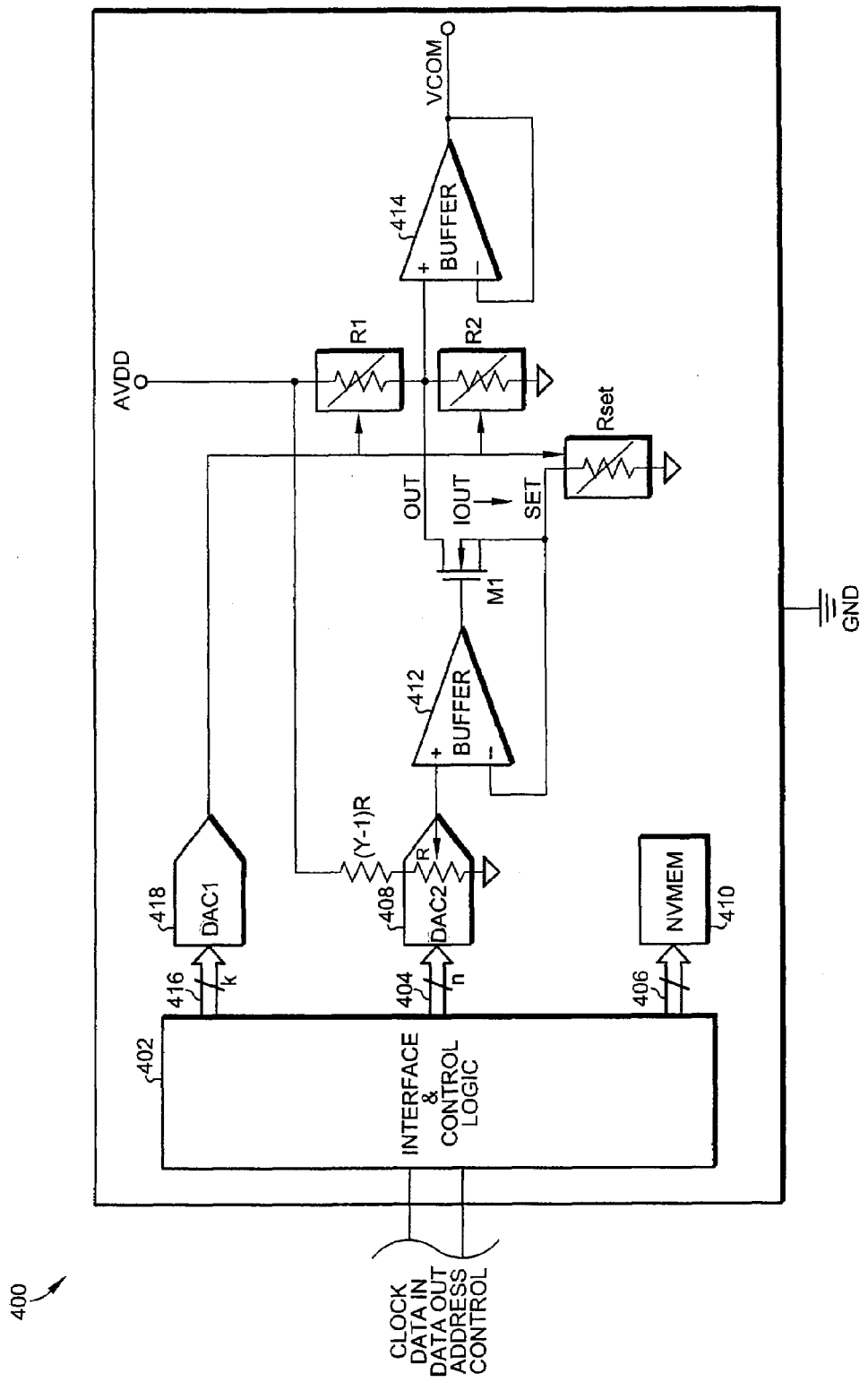
FIG. 4 is a schematic diagram of a VCOM calibrator circuit having internal programmable resistive arrays in an integrated circuit with the other calibrator circuitry according to the present invention.

Referring now to FIG. 4, a schematic diagram of a VCOM calibrator 400 is shown having integrated programmable resistors according to the present invention. Calibrator 400 includes an interface and control block 402, a bus 416 for communicating with a first DAC ("Digital to Analog Converter") 418, a bus 404 for communicating with a second DAC 408, and a bus 406 for communicating with non-volatile memory block 410. The output of DAC 408 is coupled to the positive input of buffer 412, which drives the gate of transistor M1. The source of transistor M1 is coupled to the $R_{SET}$ resistor at the SET node. The drain of transistor M1 is coupled to the output of an internal integrated resistor divider at the OUT node. The internal integrated resistor divider includes resistors R1 and R2, which is coupled between the AVDD power supply and ground. The OUT node is buffered through buffer 414 to provide the VCOM voltage. The output of the second DAC 408 is coupled to the control inputs of adjustable integrated resistors R1, R2, and RSET as is shown in FIG. 4. Note that the reference inputs of DAC 408 are coupled between AVDD and ground and include "Y" resistors having a value of "R" each. Thus, a total resistance of YR is coupled between AVDD and ground.

Figure 1:
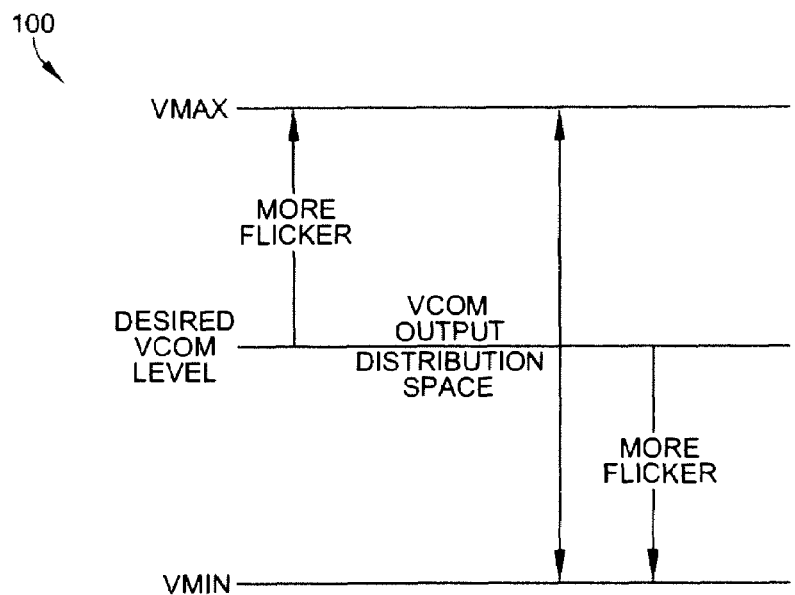
FIG. 1 is a diagram that shows the relationship between VCOM level distribution and LCD flicker intensity according the prior art.
Figure 2:
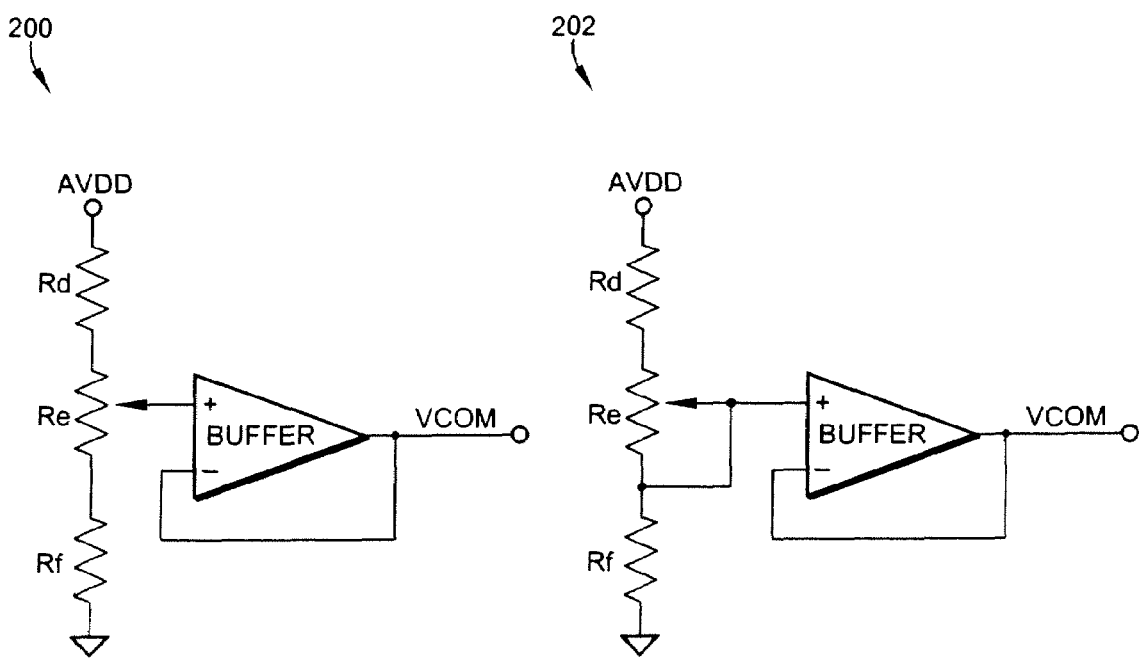
FIG. 2 is a schematic diagram of two prior art VCOM calibrator circuits each using a mechanical potentiometer.
Figure 3:
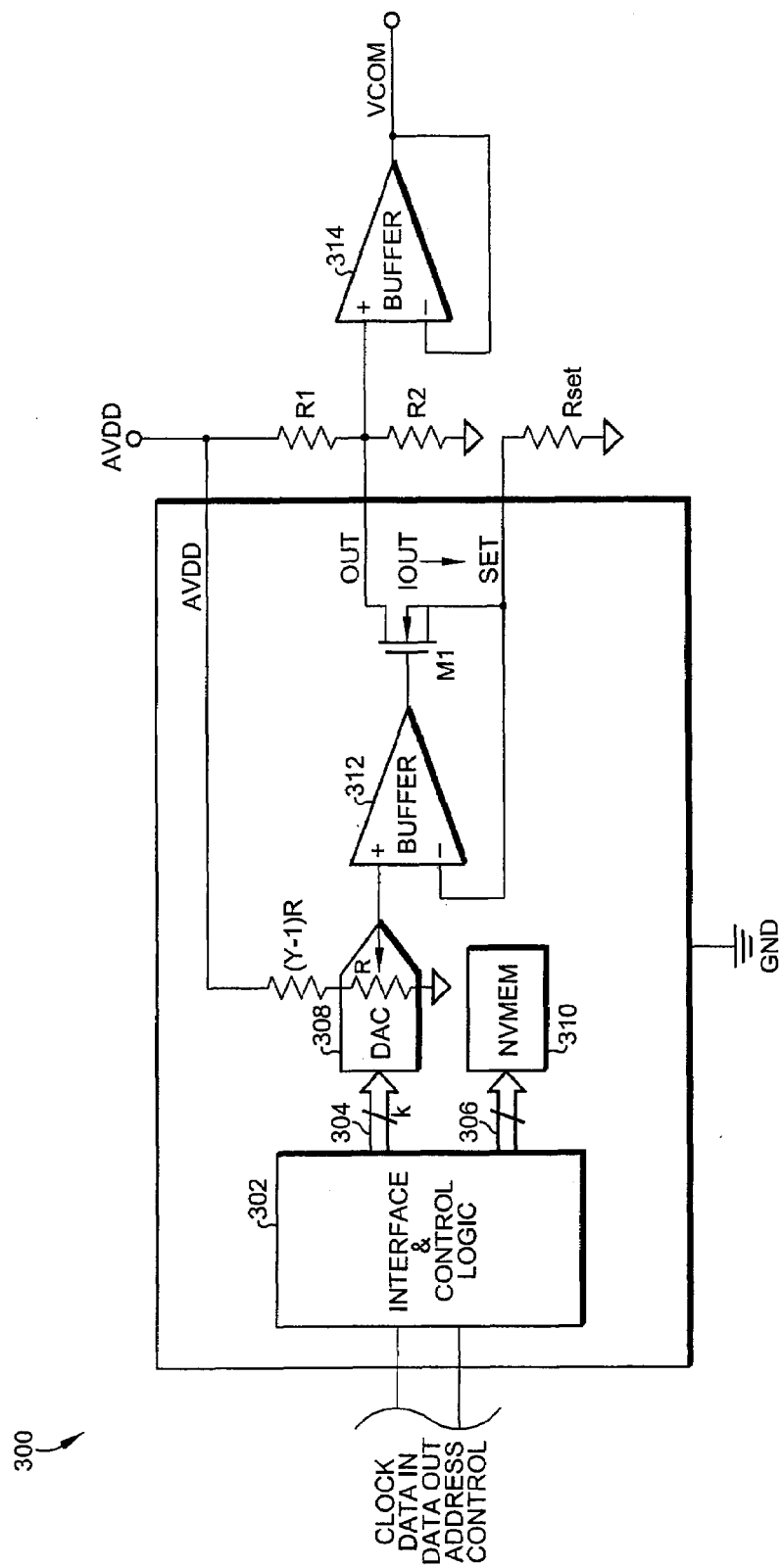
FIG. 3 is a schematic diagram of a prior art VCOM calibrator circuit using an external resistive voltage-divider.

In FIG. 4, the functional blocks of the VCOM calibrator 400 with internal programmable resistors are different from the prior art calibrators with an external resistive voltage-divider as follows:
1) R1, R2 and $R_{SET}$ are external resistors in PRIOR ART FIG. 3 whereas they are integrated on chip in FIG. 4, according to the present invention.
2) The values of R1, R2 and $R_{SET}$ are fixed in PRIOR ART FIG. 3 whereas they are programmable in FIG. 4.
3) There is only one DAC to change the VCOM level in PRIOR ART FIG. 3 whereas there are two DACs for adjusting the VCOM level in FIG. 4. The first DAC 418 is used to program resistors R1, R2 and $R_{SET}$ for selection of the adjustment range. The second DAC 408 has a similar function to the sole DAC shown in FIG. 3, whose function is to change the VCOM level.

The basic operating procedure of VCOM calibrator 400 with integrated programmable resistors can be summarized in two main steps:
1) Change the value of the first DAC 418 (k bits) to select a sub-range that contains the desired VCOM level within the probable range of the VCOM level distribution (generally between ⅓*AVDD and ⅔*AVDD, where AVDD is the analog voltage supply). This step is called coarse adjustment.
2) After the desired sub-range is found, change the value of the second DAC 408 (n bits) to achieve the desired VCOM level within this sub-range. This step is called fine adjustment.

Figure 5:
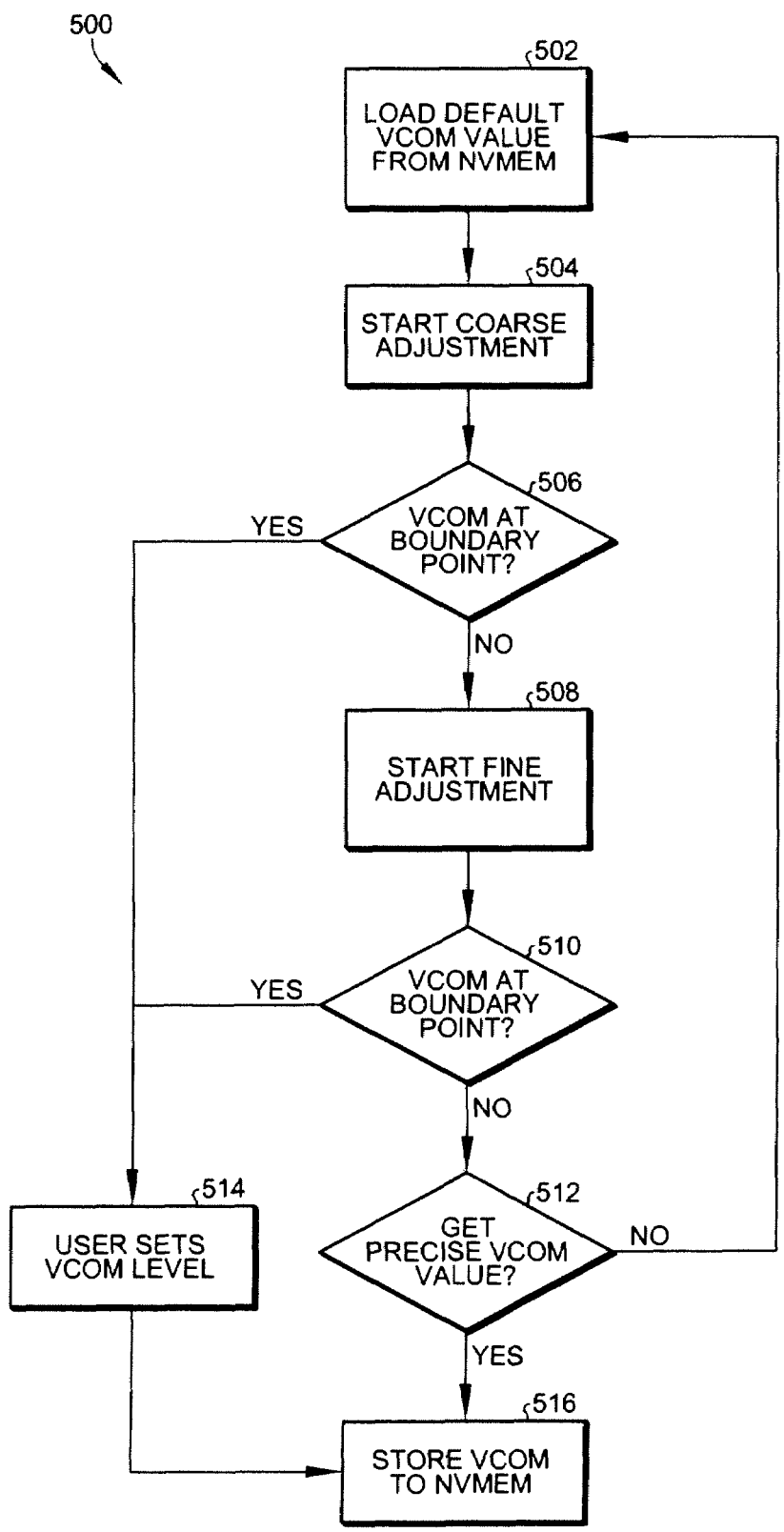
FIG. 5 is a flow chart of a VCOM adjustment procedure using the integrated programmable resistors of the present invention.

The flow chart of the adjustment procedure 500 is shown in FIG. 5. In FIG. 5, "VCOM at boundary point" means that the optimum flicker intensity of LCD panel is already achieved before adjustment and so there is no need to further adjust the VCOM level at all. Step 502 loads the default value of VCOM from the NVMEM 410. Steps 504 starts the coarse adjustment. Decision diamond 506 asks whether or not the VCOM level has reached the boundary point as described above. If the answer is yes, the adjustment procedure proceeds to step 514, described below. If the answer is no, the adjustment procedure proceeds to step 508. Step 508 starts the fine adjustment. Decision diamond 510 asks whether or not the VCOM level has now reached the boundary point as described above. If the answer is yes, the adjustment procedure proceeds to step 514, described below. If the answer is no, the adjustment procedure proceeds to decision diamond 512. Decision diamond asks whether or not a precise value of the VCOM voltage is obtained. If the answer is no, the procedure returns to initial step 502. If the answer is yes, the procedure proceeds to step 516 and the precise VCOM value is stored in NVMEM 410. For a yes answer at 506 or 510, the procedure proceeds to step 514 wherein the user sets the VCOM level, and then proceeds to step 516 for storing the final VCOM value.

Figure 6:
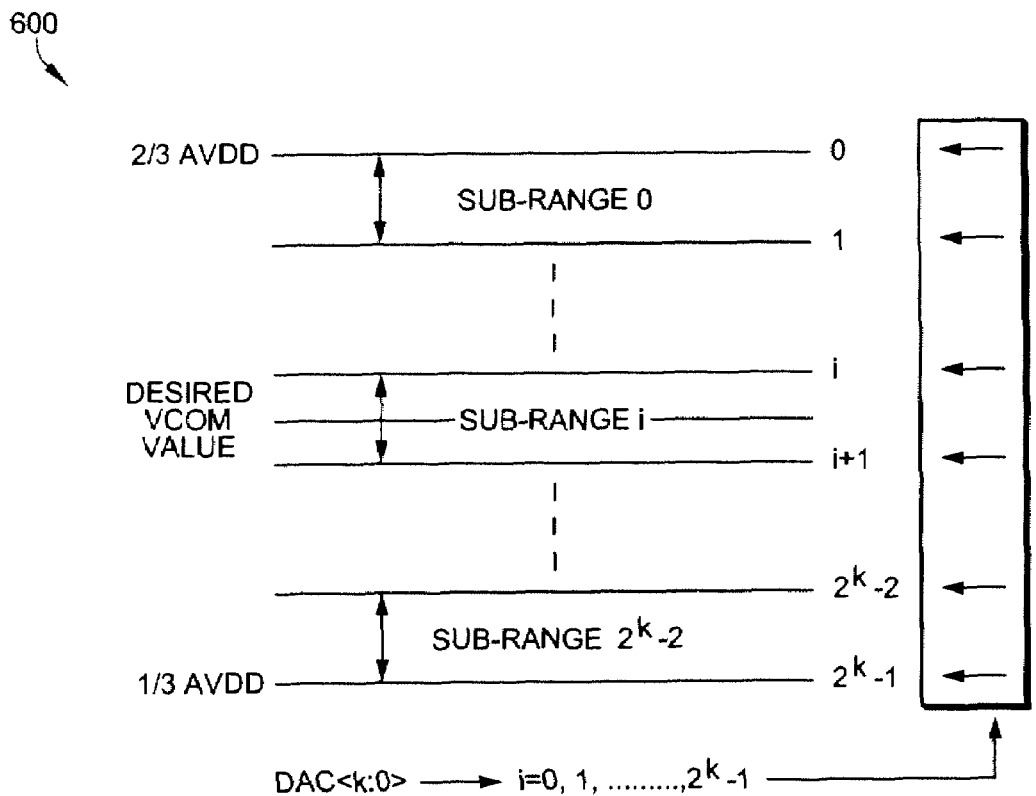
FIG. 6 is a diagram that illustrates the coarse adjustment of the VCOM level according to the present invention.

The desired value of VCOM is generally in the range between $(1/3)*AVDD$ and $(2/3)*AVDD$, depending upon the manufacturer of the LCD display. And so the range for the coarse adjustment should cover this entire range. In the coarse adjustment, the overall range from $(1/3)*AVDD$ to $(2/3)*AVDD$ is separated into $2^k-1$ identical sub-ranges whose serial numbers are from 0 to $2^k-2$ as shown in diagram 600 of FIG. 6.

During coarse adjustment, the value of the first DAC, "i", is changed between 0 and $2^k-1$ with a default value $2^{k-1}-1$ and the value of the second DAC is kept constant at zero. Thus, the ratio of R1/R2 is changed and the output of VCOM is:

$$VCOM(i) = \frac{AVDD}{\left(1 + \frac{R1}{R2}\right)} = \left(\frac{2}{3} - \frac{i}{3*(2^k-1)}\right)*AVDD \quad (7)$$

$$i = 0, 1 \ldots 2^k - 1$$

According to Equation (7), if "i" is increased by one, the VCOM output decreases by $AVDD/(3*(2^k-1))$. Thus the resolution for the coarse adjustment of VCOM is $AVDD/(3*(2^k-1))$.

The ratio of R1 to R2 can be obtained from Equation (7):

$$\frac{R1}{R2} = \left(\frac{2^k - 1 + i}{2^{k+1} - 2 - i}\right) \quad (8)$$

$$i = 0, 1 \ldots 2^k - 1$$

With this procedure, the sub-range that contains the desired VCOM level can be found by observing the flicker intensity degree of the LCD panel. For example, if "i" is changed from 1 to 3 and the flicker intensity is: flicker intensity (i=1)>flicker intensity (i=3)>flicker intensity (i=2), then the desired VCOM level is in sub-range 2.

Figure 7:
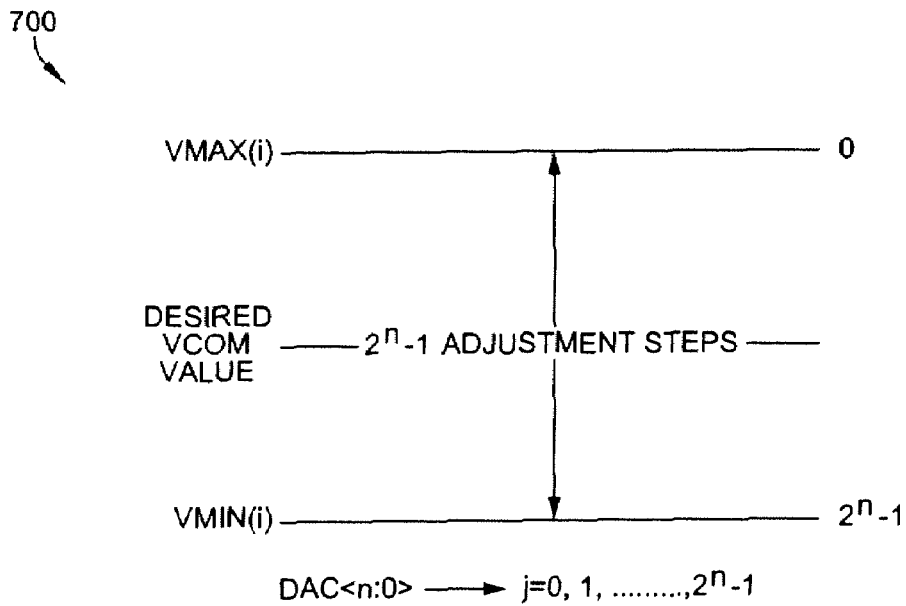
FIG. 7 is a diagram that illustrates the fine adjustment of the VCOM level according to the present invention.

After the sub-range is found, the fine adjustment of VCOM level is carried out within this sub-range. FIG. 7 is the illustration of the fine adjustment of VCOM level. In FIG. 7, it is assumed that the desired VCOM level is in sub-range "i", so we obtain $V_{MAX}$=VCOM(i) and $V_{MIN}$=VMAX(i+1)=VCOM(i+1) for fine adjustment. The fine adjustment step is similar to that of the VCOM calibrator with an external resistive voltage-divider. The value of the second DAC, "j", is changed between zero and $2^n-1$ to vary the VCOM output and find the optimum VCOM level.

VCOM(i, j) equals:

$$VCOM(i, j) = \left(\frac{2}{3} - \frac{i}{3*(2^k-1)}\right)*AVDD*\left(1 - \frac{j}{2^n-1}*\frac{R1}{Y*R_{SET}}\right) \quad (9)$$

$$i = 0, 1 \ldots 2^k - 2;$$

$$j = 0, 1 \ldots 2^k - 1$$

where Y=number of resistor R in the second DAC.

$V_{MAX}(i)$ is:

$$V_{MAX}(i) = VCOM(i) \approx \left(\frac{2}{3} - \frac{i}{3*(2^k-1)}\right)*AVDD \quad (10)$$

$$i = 0, 1 \ldots 2^k - 2$$

$V_{MIN}(i)$ is:

$$V_{MIN}(i) = \left(\frac{2}{3} - \frac{i}{3*(2^k-1)}\right)*AVDD*\left(1 - \frac{R1}{Y*R_{SET}}\right) \quad (11)$$

$$i = 0, 1 \ldots 2^k - 2$$

Y=number of resistors R in the second DAC.

Due to $V_{MIN}(i)=V_{MAX}(i+1)$, it can be shown that:

$$\frac{R1}{R_{SET}} = \left(\frac{Y}{2^{k+1} - 2 - i}\right) \quad (12)$$

$$i = 0, 1 \ldots 2^k - 2;$$

where Y=the number of resistors R in the second DAC.

Within these $2^n-1$ adjustment steps, the optimum "fine" VCOM level can be located.

The sub-range for fine adjustment is:

$$\text{Sub-range} = \frac{AVDD}{3*(2^k-1)} \quad (13)$$

The resolution for fine adjustment is:

$$\text{Resolution} = \frac{AVDD}{3*(2^k-1)*(2^n-1)} \quad (14)$$

From Equation (8), it can be shown that the sum of the numerator and the denominator of R1/R2 (i.e. R1+R2) is a constant and it is equal to $3*(2^k-1)$. We can use $R_{UNIT}$ to denote them where $R_{UNIT}$ is a unit resistor whose value should be determined by its electrical characteristics.

The parameter implementation of R1/R2 and R1/$R_{SET}$ obtained from Equation (8) and Equation (12) are listed in Table 1.

TABLE 1

PARAMETER IMPLEMENTATION of R1, R2 AND $R_{SET}$

| i | R1 ($R_{UNIT}$) | R2 ($R_{UNIT}$) | $R_{SET}$ ($R_{UNIT}$) |
|---|---|---|---|
| 0 | $2^k - 1$ | $2^{k+1} - 2$ | $(2^k - 1) * (2^{k+1} - 2)/Y$ |
| 1 | $2^k$ | $2^{k+1} - 3$ | $2^k * (2^{k+1} - 3)/Y$ |
| 2 | $2^k + 1$ | $2^{k+1} - 4$ | $(2^k + 1) * (2^{k+1} - 4)/Y$ |
| 3 | $2^k + 2$ | $2^{k+1} - 5$ | $(2^k + 2) * (2^{k+1} - 5)/Y$ |
| ... | ... | ... | ... |
| $2^k - 4$ | $2^{k+1} - 5$ | $2^k + 2$ | $(2^k + 2) * (2^{k+1} - 5)/Y$ |
| $2^k - 3$ | $2^{k+1} - 4$ | $2^k + 1$ | $(2^k + 1) * (2^{k+1} - 4)/Y$ |
| $2^k - 2$ | $2^{k+1} - 3$ | $2^k$ | $2^k * (2^{k+1} - 3)/Y$ |
| $2^k - 1$ | $2^{k+1} - 3$ | $2^k - 1$ | — |

In this way, the values of R1, R2 and $R_{SET}$ can be determined very simply and conveniently.

Two examples of using integrated programmable resistive arrays to adjust VCOM level are given below. In these examples, a 3-bit first DAC and a 7-bit second DAC are utilized.

EXAMPLE 1

AVDD=20V, VCOM=13V

Coarse Adjustment

Step 1:
  Load default settings: k:=3 ($011_2$)
  n:=0 ($000\ 0000_2$)
  Thus R1=10*$R_{UNIT}$, R2=11*$R_{UNIT}$
  VMAX=40/3V, VMIN=20/3V.

Step 2:
  Change k until the desired VCOM level is found in the sub-range between k=0 ($000_2$) and k=1 ($001_2$).
  The coarse adjustment range is from 20/3V to 40/3V.
  The coarse adjustment resolution is 20/21 V.

Fine Adjustment

Step 1:
  Setting: k:=5 ($101_2$)
  n:=64 ($100\ 0000_2$)
  Thus R1=7*$R_{UNIT}$, R2=14*$R_{UNIT}$, RSET=4.9*$R_{UNIT}$;
  VMAX=40/3V, VMIN=260/21 V.

Step 2:
  Change n until the desired VCOM level is found between n=44 ($010\ 1100_2$) and n=45 ($010\ 1011_2$).
  If n is chosen at 44, the output Value is 13.003V (very close to desired VCOM level of 13V) and only has a 3 mv deviation.
  The fine adjustment range is 20/21 V.
  The fine adjustment resolution is 20/2667≈7.5 mV.

EXAMPLE 2

AVDD=10V, VCOM=4.131V

Coarse Adjustment

Step 1:
  Load default settings: k:=3 ($011_2$)
  n:=0 ($000\ 0000_2$)
  Thus R1=10*$R_{UNIT}$, R2=11*$R_{UNIT}$
  VMAX=40/3V, VMIN=20/3V.

Step 2:
  Change k until the desired VCOM level is found in the sub-range between k=5 ($101_2$) and k=6 ($110_2$);
  The coarse adjustment range is from 20/3V to 40/3V.
  The coarse adjustment resolution is 20/21V.

Fine Adjustment

Step 1:
  Setting: k:=5 ($000_2$)
  n:=64 ($100\ 0000_2$)
  Thus R1=12*$R_{UNIT}$, R2=9*$R_{UNIT}$, RSET=4.9*$R_{UNIT}$;
  VMAX=30/7V, VMIN=80/21V.

Step 2:
  Change n until the desired VCOM level is found between n=64 ($100\ 0000_2$) and n=63 ($011\ 1111_2$);
  If n is chosen at 64, the output Value is 4.131V which just equals the desired VCOM level.
  In this case, the desired VCOM level is just at the "boundary point" before fine adjustment, so there is no need to carry on fine adjustment.

Figure 8:
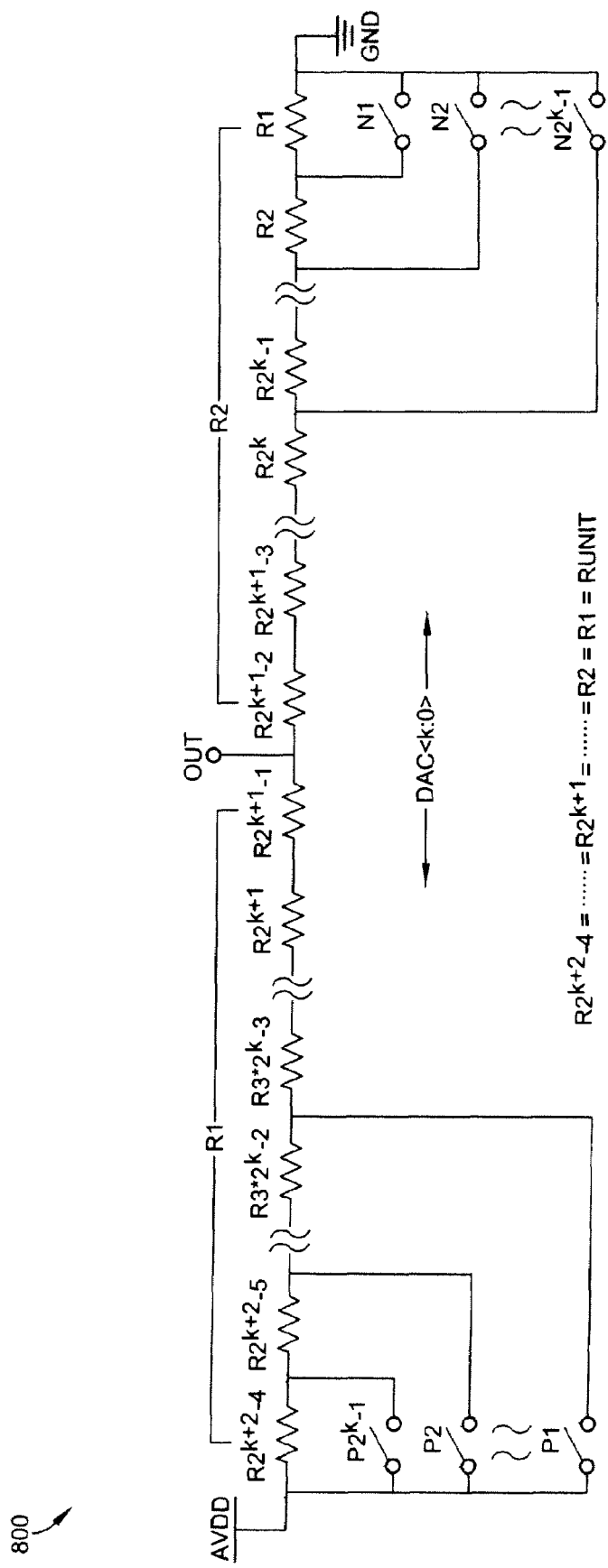
FIG. 8 is a schematic diagram of two integrated circuit arrays used to set the R1/R2 ratio according to the present invention.
Figure 9:
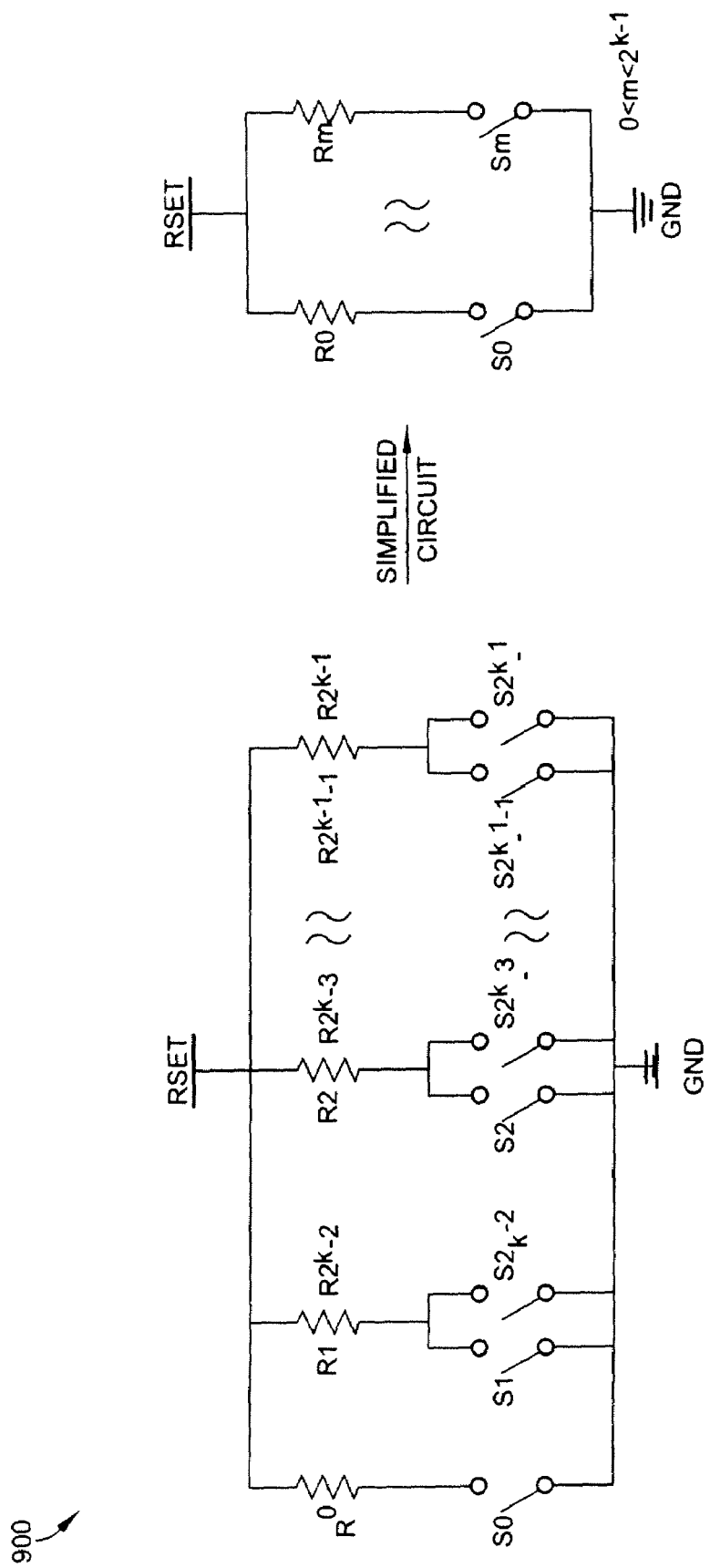
FIG. 9 is a schematic diagram of a resistor array and simplified circuit diagram used to set the value of the RSET resistor according to the present invention.

FIGS. 8 and 9 depict the implementation of realizing the R1/R2 and $R_{SET}$ values according to the present invention in greater detail. In particular, note that resistors R1 and R2 are switched arrays of resistors.

In FIG. 8, altogether $4*(2^k-1)$ resistors, which have the same unit value of resistance ($R_{UNIT}$), are put in series between AVDD and ground. Among them, $2*(2^k-1)$ resistors on the left of "OUT" constitute R1 and the remaining ones on the right constitute R2. Overall, $2*(2^k-1)$ switches which include N1~$N2^k-1$ and P1~$P2^k-1$ are used to determine the valid R2 and R1 values which in turn determine the output result. The control signals for N1~$N2^k-1$ and P1~$P2^k-1$ are listed in Table 2 below. For each "i", overall $3*(2^k-1)$ resistors are valid between AVDD and GND, others are shorted by the switches which are turned on. For example, if i=2, R1=($2^k$+1)*$R_{UNIT}$, R2=($2^{k+1}-4$)*$R_{UNIT}$ and N2=1, P3=1; Other switches are off.

Among all of these switches, $N2^k-1$ or $P2^k-1$ may need to withstand a maximum Vgd of 6.5V, which is substantially lower than that of MOS transistors used in prior art methods. Hence, the simplicity and reliability are greatly increased by using this structure and procedure according to the present invention. The VCOM output for this structure is more precise and its total used resistance value is much less than other prior art methods.

Generally, $2^{k-1}$ $R_{UNIT}$ and $2^k-1$ switches are required for the implementation of $R_{SET}$. In fact, the numbers of resistors and switches can be reduced further as long as the resolution can be guaranteed. The case below shows how it can be done.

TABLE 2

CONTROL SIGNALS FOR SWITCHES IN FIG. 8

| I | $P2^k - 1$ | $P2^k - 2$ | $P2^k - 3$ | ... | P3 | P2 | P1 | $N2^k - 1$ | $N2^k - 2$ | $N2^k - 3$ | ... | N3 | N2 | N1 |
|---|---|---|---|---|---|---|---|---|---|---|---|---|---|---|
| 0 | 0 | 0 | 0 | ... | 0 | 0 | 1 | 0 | 0 | 0 | ... | 0 | 0 | 0 |
| 1 | 0 | 0 | 0 | ... | 0 | 1 | 0 | 0 | 0 | 0 | ... | 0 | 0 | 1 |

TABLE 2-continued

CONTROL SIGNALS FOR SWITCHES IN FIG. 8

| I | $P2^k-1$ | $P2^k-2$ | $P2^k-3$ | ... | P3 | P2 | P1 | $N2^k-1$ | $N2^k-2$ | $N2^k-3$ | ... | N3 | N2 | N1 |
|---|---|---|---|---|---|---|---|---|---|---|---|---|---|---|
| 2 | 0 | 0 | 0 | ... | 1 | 0 | 0 | 0 | 0 | 0 | ... | 0 | 1 | 0 |
| $2^k-3$ | 0 | 1 | 0 | ... | 0 | 0 | 0 | 0 | 0 | 1 | ... | 0 | 0 | 0 |
| $2^k-2$ | 1 | 0 | 0 | ... | 0 | 0 | 0 | 0 | 1 | 0 | ... | 0 | 0 | 0 |
| $2^k-1$ | 0 | 0 | 0 | ... | 0 | 0 | 0 | 1 | 0 | 0 | ... | 0 | 0 | 0 |

Example

Y=20, k=3 and n=7, the parameters for R2/R1 and $R_{SET}$/R1 is provided in Table 3.

TABLE 3

PARAMETERS OF R2/R1 AND $R_{SET}$/R1 FOR Y = 20, k = 3 and n = 7

| I | R1 ($R_{UNIT}$) | R2 ($R_{UNIT}$) | $R_{SET}$ ($R_{UNIT}$) |
|---|---|---|---|
| 0 | 7 | 14 | 4.9 |
| 1 | 8 | 13 | 5.2 |
| 2 | 9 | 12 | 5.4 |
| 3 | 10 | 11 | 5.5 |
| 4 | 11 | 10 | 5.5 |
| 5 | 12 | 9 | 5.4 |
| 6 | 13 | 8 | 5.2 |
| 7 | 14 | 7 | — |

In fact, $R_{SET}$ can use just one type of resistor ($4.9*R_{UNIT}$) so as to decrease the resistor numbers from 4 to 1 and decrease the switch number from 7 to 1. This decreases $V_{MIN}$ a bit and increases the sub-range slightly. However, it is reasonable as long as the resolution is not compromised too much. The ratios of new sub-ranges when $R_{SET}=4.9*R_{UNIT}$ compared to original sub-ranges are provided in Table 4.

TABLE 4

RESULT COMPARISON FOR THE SIMPLIFIED CIRCUIT

| I | Ratio of new sub-range to original sub-range | % Change |
|---|---|---|
| 0 | 1.00 | +0% |
| 1, 6 | 1.06 | +6% |
| 2, 5 | 1.10 | +10% |
| 3, 4 | 1.12 | +12% |

In the worst case when AVDD=20V, the sub-range is changed from 0.950V to 1.065V and the resolution is changed from 7.5 mV to 8.9 mV (with an increase for +12%). The difference is quite insignificant compared to the overall range. If one resistor is not enough to guarantee the resolutions for all sub-ranges, we can add some more resistors. However, the total number of resistors used is still less than $2^k-1$. As a result, the number of resistors and switches can be greatly decreased.

While there have been described above the principles of the present invention, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein.

Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A calibrator comprising:
   a first Digital-to-Analog converter;
   a second Digital-to-Analog converter;
   a first resistor coupled between a power supply voltage and a calibrator output having an adjustable value controlled by the first Digital-to-Analog converter;
   a second resistor coupled between the calibrator output and ground having an adjustable value controlled by the first Digital-to-Analog converter; and
   a set resistor coupled between an output of the second Digital-to-Analog converter and ground, wherein the current flowing through the set resistor is sourced from the calibrator output.

2. The calibrator of claim 1 wherein the first Digital-to-Analog converter receives an input word having a first number of bits.

3. The calibrator of claim 2 wherein the input word comprises three bits.

4. The calibrator of claim 2 wherein the second Digital-to-Analog converter receives an input word having a second number of bits.

5. The calibrator of claim 4 wherein the input word comprises seven bits.

6. The calibrator of claim 1 wherein the first resistor comprises a programmable integrated circuit resistor.

7. The calibrator of claim 1 wherein the second resistor comprises a programmable integrated circuit resistor.

8. The calibrator of claim 1 wherein the set resistor comprises a programmable integrated circuit resistor.

9. The calibrator of claim 1 further comprising an interface and control logic block for receiving a clock signal and a data input signal, for providing a first digital input signal for the first Digital-to-Analog converter, and for providing a second digital input signal for the second Digital-to-Analog converter.

10. The calibrator of claim 9 further comprising a non-volatile memory coupled to the interface and control logic block.

11. The calibrator of claim 1 further comprising a buffer having a first input coupled to the second Digital-to-Analog converter, a second input coupled to the set resistor, and a current output coupled to the calibrator output.

12. The calibrator of claim 1 further comprising a buffer coupled to the calibrator output.

13. The calibrator of claim 1 further comprising changing an output value of the first Digital-to-Analog converter to select a sub-range that contains a desired calibrator output value.

14. The calibrator of claim 1 wherein the desired calibrator output value is between one-third and two-thirds of the power supply voltage.

15. The calibrator of claim 13 further comprising changing an output value of the second Digital-to-Analog converter to achieve the desired calibrator output value.

16. A calibration method comprising:
   providing a first Digital-to-Analog converter;
   providing a second Digital-to-Analog converter;
   coupling a first resistor between a power supply voltage and a calibrator output having an adjustable value controlled by the first Digital-to-Analog converter;
   coupling a second resistor coupled between the calibrator output and ground having an adjustable value controlled by the first Digital-to-Analog converter;
   coupling a set resistor between an output of the second Digital-to-Analog converter and ground; and
   sourcing the current flowing through the set resistor is from the calibrator output.

17. The method of claim 16 further comprising changing an output value of the first Digital-to-Analog converter to select a sub-range that contains a desired calibrator output value.

18. The method of claim 17 wherein the desired calibrator output value is between one-third and two-thirds of the power supply voltage.

19. The method of claim 17 further comprising changing an output value of the second Digital-to-Analog converter to achieve the desired calibrator output value.

20. A calibrator comprising:
   a first resistor, a second resistor, and set resistor in an integrated circuit having an adjustable value controlled by a first Digital-to-Analog converter;
   a resistor divider formed by the first and second resistors having a calibrator output; and
   a second Digital-to-Analog converter for controlling the voltage across the set resistor, wherein the current through the set resistor is sourced from the calibrator output.

* * * * *